United States Patent
Hisada et al.

(10) Patent No.: US 6,578,181 B2
(45) Date of Patent: Jun. 10, 2003

(54) DEVICE AND METHOD FOR ANALYZING A CIRCUIT, AND A COMPUTER PRODUCT

(75) Inventors: Toshimasa Hisada, Tokyo (JP); Hiroyuki Dakeno, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 147 days.

(21) Appl. No.: 09/734,211

(22) Filed: Dec. 12, 2000

(65) Prior Publication Data

US 2002/0007477 A1 Jan. 17, 2002

(30) Foreign Application Priority Data

Jul. 13, 2000 (JP) ........................................ 2000-213128

(51) Int. Cl.$^7$ .............................................. G06F 17/50
(52) U.S. Cl. ................................ 716/5; 716/4; 716/10; 324/638; 324/637; 703/2; 703/14; 714/55; 714/24; 714/37
(58) Field of Search ..................... 716/1–21; 250/330; 324/638, 73.1, 76.82; 326/30; 342/98; 367/7; 702/117, 79; 703/2; 706/20; 714/33

(56) References Cited

U.S. PATENT DOCUMENTS

| | | | | |
|---|---|---|---|---|
| 5,939,721 A | * | 8/1999 | Jacobsen et al. | ............ 250/330 |
| 6,047,247 A | * | 4/2000 | Iwanishi et al. | ............ 702/117 |
| 6,137,293 A | * | 10/2000 | Wu et al. | ................... 324/638 |
| 2001/0041970 A1 | * | 11/2001 | Fujimori et al. | ............... 703/2 |

FOREIGN PATENT DOCUMENTS

JP        6-11528       1/1994

\* cited by examiner

*Primary Examiner*—Matthew Smith
*Assistant Examiner*—Helen Rossoshek
(74) *Attorney, Agent, or Firm*—Leydig, Voit & Mayer, Ltd.

(57) ABSTRACT

A circuit analyzing device comprises a wiring model information extracting section for generating wiring model information for each wiring of a circuit, a circuit simulation section for analyzing waveform propagation characteristics of each wiring model information that has been extracted by the wiring model information extracting section, a spectrum characteristic information calculating section, a linear simulation section, and an S parameter information calculating section.

13 Claims, 16 Drawing Sheets

FIG.6

| FREQUENCY | S11 | | S21 | | S12 | | S22 | |
|---|---|---|---|---|---|---|---|---|
| | mag | ang | mag | ang | mag | ang | mag | ang |
| 10kHz | 0.57 | 30.612 | 0.19 | 16.321 | 0.044 | -21.95 | 0.016 | -53.26 |
| 20kHz | 0.007 | -74.89 | 0.0032 | -88.88 | 0.0016 | -98.24 | 0.00008 | -107.7 |

DEVICE AND METHOD FOR ANALYZING A CIRCUIT, AND A COMPUTER PRODUCT

FIELD OF THE INVENTION

The present invention relates to a device and a method for analyzing waveform propagation of a digital signal in a circuit based on circuit diagram information or the like, and a computer-readable recording medium recorded with a program for making a computer execute the method according to the present invention.

BACKGROUND OF THE INVENTION

FIG. 16 is a diagram showing a structure and a data flow of a conventional circuit analyzing device. This circuit analyzing device includes a circuit diagram information generating section 81 for supporting preparation of a circuit diagram and for generating circuit diagram information (information on a circuit diagram) D81, a layout pattern information generating section 82 for generating layout pattern information (information on a layout pattern) of this circuit, and an element information extracting section 83 for extracting element information (information on a circuit element and a parasitic element) D82 from the layout pattern generated by the layout pattern information generating section 82.

Further, this circuit analyzing device includes a circuit connection information extracting section 84 for extracting net list information (circuit connection information) D83 of the whole circuit, based on the circuit diagram information D81 generated by the circuit diagram information generating section 81 or the element information D82 extracted by the element information extracting section 83, a circuit simulation section 85 for simulating the analysis of a transient response of a circuit using the net list information D83 extracted by the circuit connection information extracting section 84, and a waveform display section 86 for displaying a waveform of a result of the analysis of the circuit simulation section 85.

FIG. 17 is a flowchart showing a flow of the operation of the conventional circuit analyzing device. First, the circuit diagram information generating section 81 generates the circuit diagram information D81 or the layout pattern information generating section 82 generates the layout pattern information, and the element information extracting section 83 extracts the element information D82 (S81). Subsequently, the circuit connection information extracting section 84 extracts the net list information D83 from the circuit diagram information D81 or from the element information D82 (S82). Subsequently, the circuit simulation section 85 simulates the analysis of a transient response of a circuit using the net list information D83 (S83). Subsequently, the waveform display section 86 displays a waveform of a result of the analysis (S84). A user visually observes this waveform, and confirms the whole wiring to see whether there is a problem or not in the waveform propagation characteristics of the digital signal (S85).

In the conventional circuit analyzing device, however, a simulation is carried out for the whole circuit, and the user visually observes the waveform of a result of the analysis, and confirms whether there is a problem or not in the waveform propagation characteristics of the digital signal. Therefore, there has been a problem that there is a reduction in the reliability in the decision made on the waveform propagation characteristics of each wiring of the circuit. Further, there has been a problem that substantial time and labor are required for analyzing the circuit.

SUMMARY OF THE INVENTION

It is an object of this invention to provide, a device and a method for analyzing a circuit that can improve the reliability in the decision made on the waveform propagation characteristics of each wiring of the circuit and that can decrease the time and labor required for analyzing the circuit, and a computer-readable recording medium recorded with a program for making a computer execute the method according to the present invention.

According to one aspect of this invention, there is provided a circuit analyzing device comprising a wiring model information generating unit for generating wiring model information for each wiring of a circuit; and an analyzing unit for analyzing waveform propagation characteristics of each wiring model information that has been generated by the wiring model information generating unit. The wiring model information generating unit generates wiring model information for each wiring of a circuit, and the analyzing unit analyzes waveform propagation characteristics of each wiring model information that has been generated by the wiring model information generating unit. Therefore, it is possible to obtain quantitative information for making a decision, and it becomes easily possible to make a secure decision for each wiring.

Further, the wiring model information generating unit generates the wiring model information including LC circuit parasitic and RC circuit parasitic information based on layout information of the circuit. Therefore, it is possible to carry out a more suitable analysis particularly in the case of analyzing a circuit that processes a high-frequency digital signal of 1 GHz or above.

Further, the analyzing unit analyzes spectrum characteristics and/or S parameter characteristics. Therefore, it is possible to carry out a more detailed analysis.

Further, a deciding unit is provided for automatically deciding on whether each wiring is bad or good in waveform propagation, based on a result of the analysis of the analyzing unit. The deciding unit automatically decides whether each wiring is bad or good in waveform propagation. Therefore, it is more easily possible to make a secure decision on good or bad of each wiring.

Further, a correction circuit information generating unit is provided for generating correction circuit information on a correction circuit having an element for correcting waveform propagation characteristics added to a wiring that has been decided as bad by the deciding unit. The correction circuit information generating unit generates correction circuit information on a correction circuit having an element for correcting waveform propagation characteristics added to a wiring that has been decided as bad by the deciding unit. Therefore, it is possible to automatically correct the waveform propagation characteristics of the bad wiring.

Further, a layout information generating unit is provided for generating layout information of the correction circuit, based on the correction circuit information that has been generated by the correction circuit information generating unit, wherein the wiring model information generating unit generates wiring model information for each wiring of the correction circuit including LC circuit parasitic and RC circuit parasitic information, based on the layout information that has been generated by the layout information generating unit. Therefore, it is possible to obtain an optimum circuit by repeatedly carrying out the analysis of the correction circuit until when there is no bad wiring.

Further, an assigning unit is provided for assigning a part of a circuit as a part to be analyzed. The wiring model information generating unit generates wiring model information for only a part of the circuit that has been assigned by this assigning unit. Therefore, it is possible to further decrease the time required for analyzing the circuit.

According to another aspect of this invention, there is provided a circuit analyzing method comprising a wiring model information generating step for generating wiring model information for each wiring of a circuit; and an analysis step for analyzing waveform propagation characteristics of each wiring model information that has been generated at the wiring model information generating step. At the wiring model information generating step, wiring model information is generated for each wiring of a circuit, and at the analysis step, waveform propagation characteristics are analyzed for each wiring model information that has been generated at the wiring model information generating step. Therefore, it is possible to obtain quantitative information for making a decision, and it becomes easily possible to make a secure decision for each wiring.

Further, at the wiring model information generating step, the wiring model information including LC circuit parasitic and RC circuit parasitic information is generated based on layout information of the circuit. Therefore, it is possible to carry out a more suitable analysis particularly in the case of analyzing a circuit that processes a high-frequency digital signal of 1 GHz or above.

Further, at the analysis step, spectrum characteristics and/or S parameter characteristics are analyzed. Therefore, it is possible to carry out a more detailed analysis.

Further, a decision step is provided for automatically deciding on whether each wiring is bad or good in waveform propagation, based on a result of the analysis at the analysis step. Thus, at the decision step, whether each wiring is bad or good in waveform propagation is automatically decided based on a result of the analysis at the analysis step. Therefore, it is easily possible to make a more secure decision on good or bad of each wiring.

Further, a correction circuit information generating step is provided for generating correction circuit information on a correction circuit having an element for correcting waveform propagation characteristics added to a wiring that has been decided as bad at the decision step. Thus, at the correction circuit information generating step, there is generated correction circuit information on a correction circuit having an element for correcting waveform propagation characteristics added to a wiring that has been decided as bad at the decision step. Therefore, it is possible to automatically correct the waveform propagation characteristics of the bad wiring.

Further, a layout information generating step is provided for generating layout information of the correction circuit, based on the correction circuit information that has been generated at the correction circuit information generating step. At the wiring model information generating step, there is generated wiring model information for each wiring of the correction circuit including LC circuit parasitic and RC circuit parasitic information, based on the layout information that has been generated at the layout information generating step. Therefore, it is possible to obtain an optimum circuit by repeatedly carrying out the analysis of the correction circuit until when there is no bad wiring.

Further, an assignment step is provided for assigning a part of a circuit as a part to be analyzed. At the wiring model information generating step, wiring model information is generated for only a part of the circuit that has been assigned at the assignment step. Therefore, it is possible to further decrease the time required for analyzing the circuit.

According to still another aspect of this invention, there is provided a computer-readable recording medium that is recorded with a program for making a computer execute any one of the above-described methods according to this invention. Therefore, the program can be read by the computer, and it becomes possible to execute the operation of the methods of the above-described aspects by the computer.

In this case, the "computer-readable recording medium" includes a "portable physical medium" such as a magnetic disk like a floppy disk, a semiconductor memory (including that incorporated in a cartridge or a PC card) like a ROM, an EPROM, an EEPROM, a flash ROM, etc., an optical disk like a CD-ROM, a DVD, etc., an optical magnetic disk like an MO, etc., and a "fixed physical medium" like a ROM, a RAM, a hard disk, etc. that are incorporated in various types of computer systems.

Further, the "computer-readable recording medium" may also include a communication medium for short-time holding a program like a communication line for transmitting a program via a network like a LAN, a WAN, Internet, etc. The "program" is a one that describes a data processing method. A language to be described and a describing method are not particularly limited, and formats of a source code, a binary code and an execution format are not limited. Further, the "program" is not necessarily limited to a one formed in a single structure, but also includes a distributed structure as a plurality of modules and libraries, and a program that achieves its function in co-operation with separate programs of an OS and the like.

Other objects and features of this invention will become apparent from the following description with reference to the accompanying drawings.

BRIEF DESCRIPTION OF THE DRAWINGS

FIG. 6 is a diagram showing one example of S parameter information relating to the first embodiment.

DESCRIPTION OF THE PREFERRED EMBODIMENTS

Five embodiments of the present invention will be explained in detail below with reference to the drawings. It should be noted that these embodiments do not limit the present invention.

Figure 1:
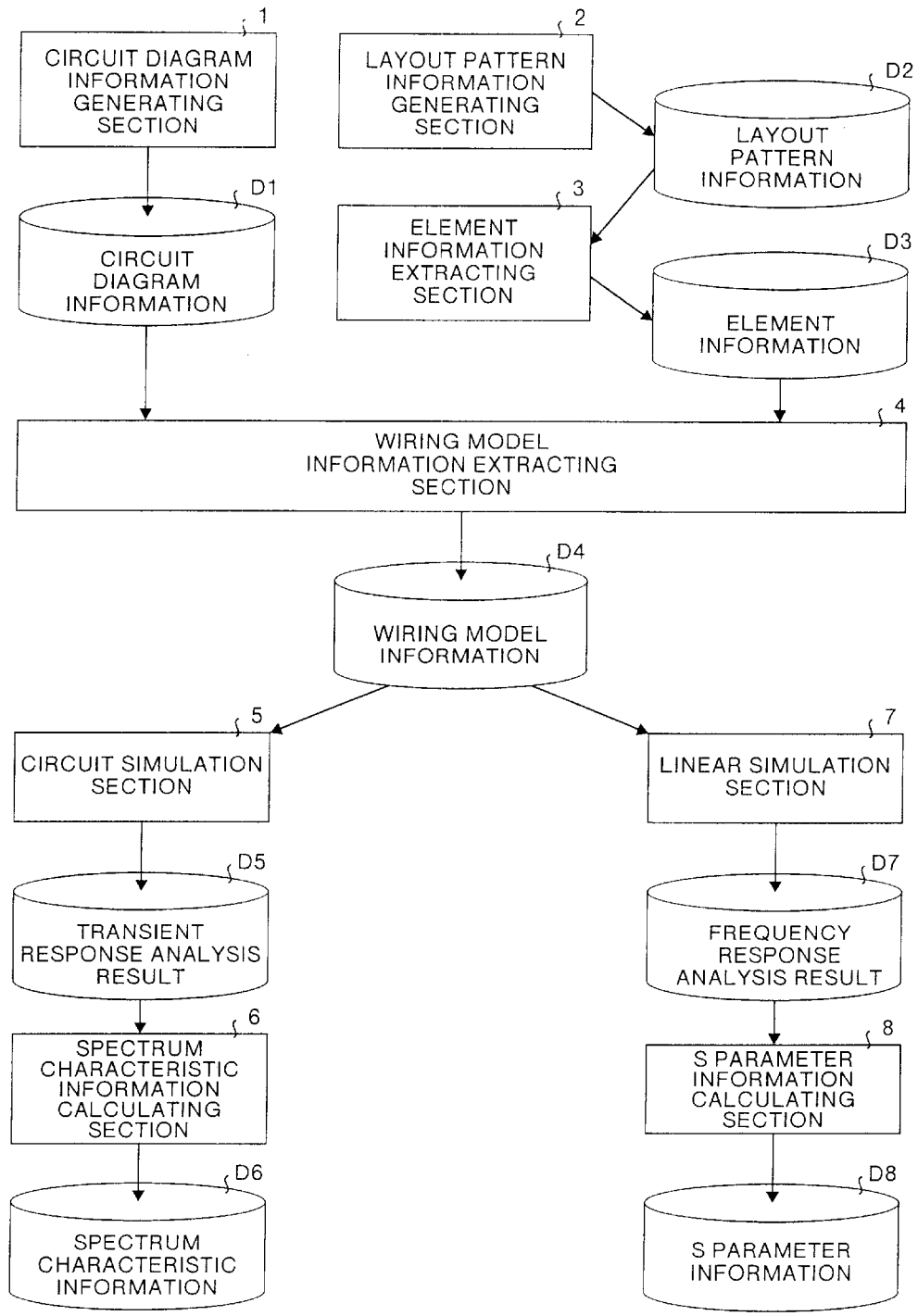
FIG. 1 is a diagram showing a structure and a data flow of a circuit analyzing device relating to a first embodiment of the present invention.

A first embodiment of this invention will now be explained. As a circuit analyzing device of a first embodiment, there will be explained a circuit analyzing device as an example that is integrally structured with a CAD (Computer-Aided Design) device for supporting a preparation of a circuit diagram and an EWS (Engineering Work Station) device and that analyzes a circuit for processing a high-frequency digital signal of 1 GHz or above. FIG. 1 is a diagram showing a structure and a data flow of a circuit analyzing device relating to the first embodiment of the present invention.

The circuit analyzing device relating to the first embodiment includes a circuit diagram information generating section 1 for supporting a preparation of a circuit diagram and for generating circuit diagram information (information on a circuit diagram) D1, a layout pattern information generating section 2 for generating layout pattern information (information on a layout pattern) D2 of this circuit, an element information extracting section 3 for extracting element information (information on a circuit element and a parasitic element) D3 from the layout pattern information D2 generated by the layout pattern information generating section 2, and a wiring model information extracting section 4 for extracting wiring model information D4 as circuit connection information (net list) for each wiring, based on the circuit diagram information D1 generated by the circuit diagram information generating section 1 or the element information D3 extracted by the element information extracting section 3.

Further, this circuit analyzing device includes a circuit simulation section 5 for simulating an analysis of a transient response of a circuit using the wiring model information D4 extracted by the wiring model information extracting section 4, a spectrum characteristic information calculating section 6 for calculating spectrum characteristic information (information on spectrum characteristics) D6 by Fourier transforming a result of an analysis of a transient response (information on a result of an analysis of a transient response) D5 by the circuit simulation section 5, a linear simulation section 7 for carrying out a linear simulation of analyzing a frequency response by using the wiring model information D4 extracted by the wiring model information extracting section 4, and an S parameter information calculating section 8 for calculating S parameter information D8 from a result of an analysis of a frequency response (information on a result of an analysis of a frequency response) D7 by the linear simulation section 7.

The circuit diagram information generating section 1 supports a preparation of a circuit diagram and generates the circuit diagram information D1. The layout pattern information generating section 2 generates the layout pattern information D2 of this circuit. The element information extracting section 3 extracts the element information D3 from the layout pattern information D2 generated by the layout pattern information generating section 2. In this case, the element information extracting section 3 extracts the information including LC circuit parasitic and RC circuit parasitic information. The wiring model information extracting section 4 extracts the wiring model information D4 as circuit connection information for each wiring, based on the circuit diagram information D1 generated by the circuit diagram information generating section 1 or the element information D3 extracted by the element information extracting section 3.

The circuit simulation section 5 simulates an analysis of a transient response of a circuit, using the wiring model information D4 extracted by the wiring model information extracting section 4 and a waveform condition of an input signal stored in advance. The spectrum characteristic information calculating section 6 calculates the spectrum characteristic information D6 by Fourier transforming the transient response analysis result D5 of the circuit simulation section 5 by using an FFT (Fast Fourier Transform) algorithm or the like. The linear simulation section 7 carries out a linear simulation of analyzing a frequency response by using the wiring model information D4 extracted by the wiring model information extracting section 4 and a frequency condition of an input signal stored in advance.

The S parameter information calculating section 8 calculates the S parameter information (a reflection component S11 parameter, etc.) D8 from the frequency response analysis result D7 of the linear simulation section 7. The S parameter is a parameter that is obtained by measuring transfer characteristics and reflection characteristics of a circuit network, by terminating the input terminal and the output terminal of the circuit with characteristic impedance respectively. The spectrum characteristic information D6 and the S parameter information D8 can be utilized as quantitative information in making good or bad decision of each wiring.

While the structure of the circuit analyzing device has been described above, those constituent elements of the circuit analyzing device are of a functional concept, and they may not be necessarily structured as physically shown in the drawing. For example, the whole or a part of the processing functions of the circuit analyzing device may be realized by a CPU (Central Processing Unit) not shown and a program that is interpreted and executed by this CPU. In other words, in a ROM not shown, there is stored a computer program for giving an instruction to the CPU and for making the CPU execute various kinds of processing in co-operation with an OS (Operation System) and the like. The CPU executes various kinds of processing according to this program.

The whole or a part of the processing functions of the circuit analyzing device can also be realized as hardware based on a wired logic. It is also possible to realize various constituent elements and processing functions of the circuit analyzing device in second to fifth embodiments to be described later by the CPU and a wired logic in a similar manner.

The element information extracting section 3 and the wiring model information extracting section 4 correspond to the wiring model information generating unit of this invention, and the circuit simulation section 5, the spectrum characteristic information calculating section 6, the linear simulation section 7, and the S parameter information calculating section 8 correspond to the analyzing section of this invention respectively.

Figure 2:
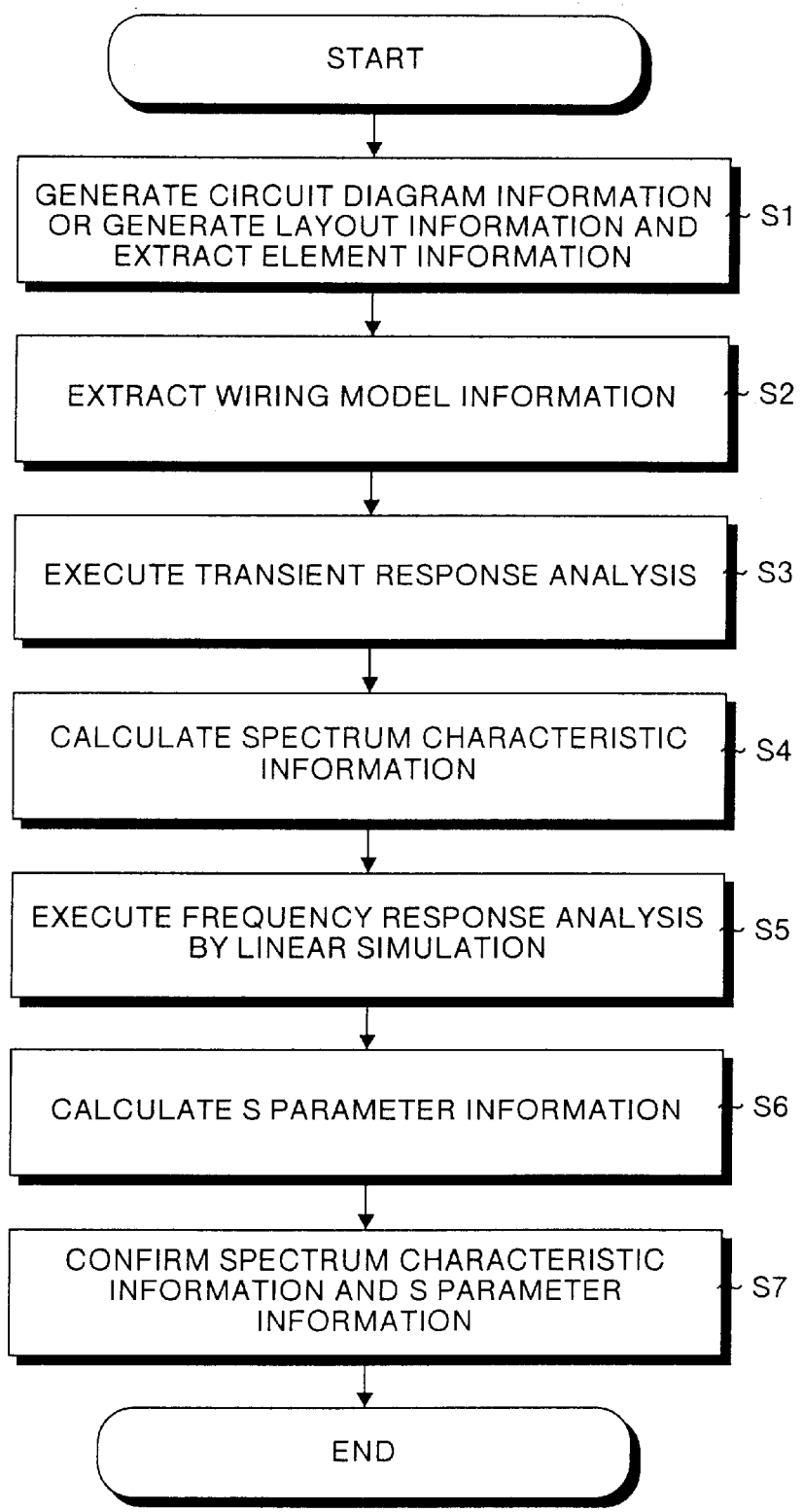
FIG. 2 is a flowchart showing a flow of the operation of the circuit analyzing device relating to the first embodiment.

The operation of the first embodiment will be explained with reference to FIG. 2 to FIG. 6. FIG. 2 is a flowchart showing a flow of the operation of the circuit analyzing device relating to the first embodiment. First, the circuit diagram information generating section 1 generates the circuit diagram information D1 or the layout pattern information generating section 2 generates the layout pattern information D2, and the element information extracting section 3 extracts the element information D3 (S1). Subsequently, the wiring model information extracting section 4 extracts the wiring model information from the circuit diagram information D1 or from the element information D3 (S2).

Figure 3:
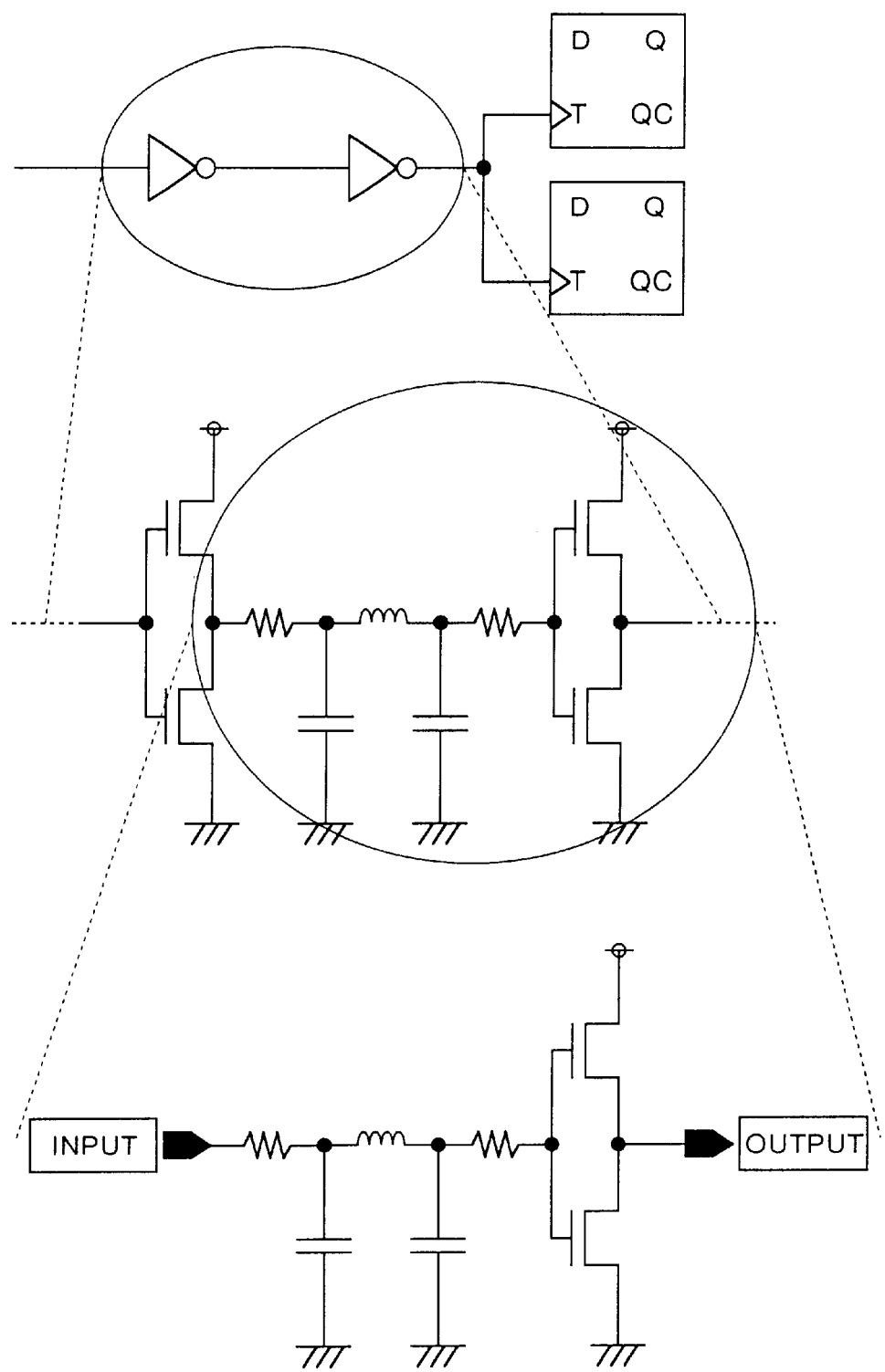
FIG. 3 is an explanatory diagram for explaining wiring model information extraction relating to the first embodiment.

FIG. 3 is an explanatory diagram for explaining the wiring model information extraction relating to the first embodiment. When an element as shown in the center of this figure has been extracted in a circuit as shown in the top of this figure, for example, a wiring model as shown in the bottom of this figure is extracted for each wiring. In this case, the wiring model refers to a circuit that has been divided into parts corresponding to each wiring. Circuit connection information on this wiring model becomes the wiring model information.

Figure 4:
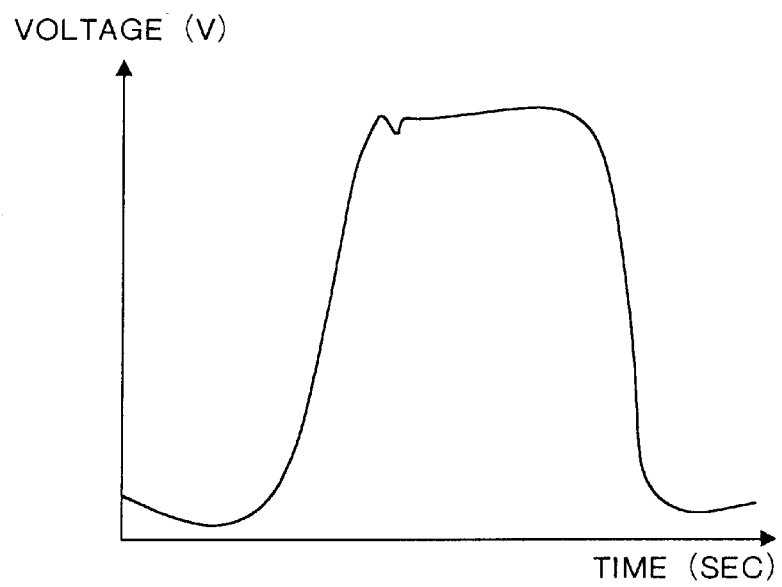
FIG. 4 is a diagram showing one example of an analysis of a transient response relating to the first embodiment.
Figure 5:
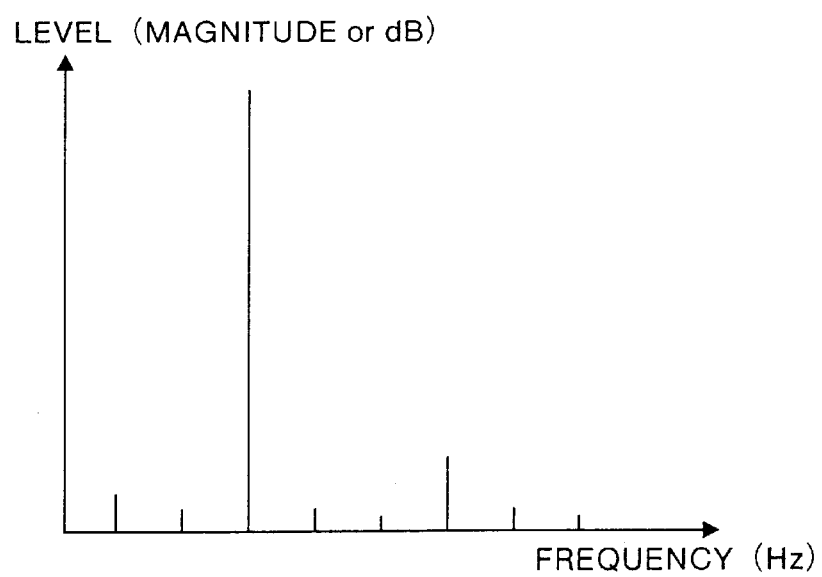
FIG. 5 is a diagram showing one example of spectrum characteristics relating to the first embodiment.

Referring back to FIG. 2, when the wiring model information has been generated at step S2, the circuit simulation section 5 executes an analysis of a transient response. As a result, a waveform of a time region, that is, the transient response analysis result D5, is generated as shown in FIG. 4 (S3). Then, the spectrum characteristic information calculating section 6 Fourier transforms the transient response analysis result D5, and calculates the spectrum characteristic information D6 as shown in FIG. 5. In the mean time, the linear simulation section 7 executes the analysis of a frequency response. Then, the S parameter information calculating section 8 calculates the S parameter information D8 as shown in FIG. 6. A user can easily make a secure decision on good or bad of each wiring by referring to the spectrum characteristic information D6 and the S parameter information D8 as quantitative information.

As described above, according to the first embodiment, the wiring model information extracting section 4 generates the wiring model information D4 for each wiring, and the circuit simulation section 5, the spectrum characteristic information calculating section 6, the linear simulation section 7, and the S parameter information calculating section 8 analyze the waveform propagation characteristics of each wiring model information D4. Therefore, it is possible to obtain quantitative information for deciding on good or bad of each wiring, thereby making it possible to easily make a secure decision on good or bad of each wiring. As a result, it is possible to improve the reliability in the decision made on good or bad of the waveform propagation characteristics for each wiring of the circuit. Further, it is possible to decrease the time and labor required for the circuit analysis.

Further, as the element information extracting section 3 and the wiring model information extracting section 4 generate the wiring model information including the LC circuit parasitic and RC circuit parasitic information based on the layout pattern information on the circuit, it is possible to carry out a more suitable analysis particularly when a circuit for processing a high-frequency digital signal of 1 GHz or above is to be analyzed. Further, as the circuit simulation section 5, the spectrum characteristic information calculating section 6, the linear simulation section 7, and the S parameter information calculating section 8 analyze the spectrum characteristics and the S parameter characteristics, it becomes possible to carry out a further detailed analysis.

Figure 7:
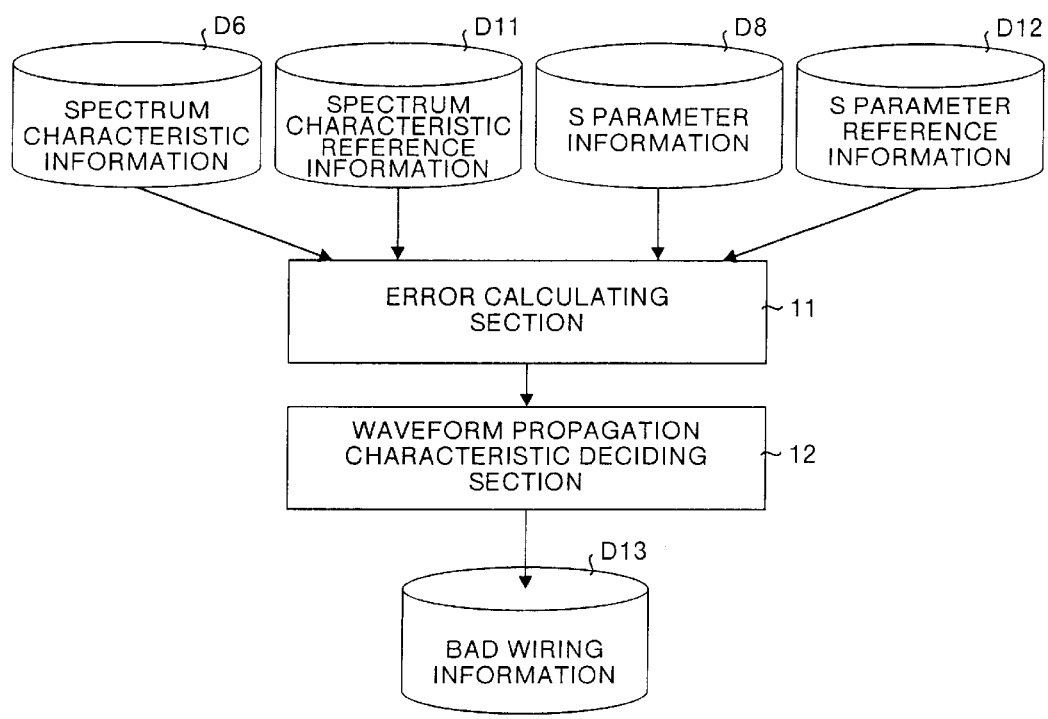
FIG. 7 is a diagram showing a structure and a data flow of a circuit analyzing device relating to a second embodiment of the present invention.

A second embodiment of this invention will now be explained. According to the second embodiment of this invention, good or bad of each wiring is further automatically decided in the first embodiment. The basic structure and the basic operation of the second embodiment are similar to those of the first embodiment, and therefore, only different parts will be explained here. FIG. 7 is a diagram showing a structure and a data flow of a circuit analyzing device relating to the second embodiment of the present invention.

The circuit analyzing device of the second embodiment further includes, in addition to the structure of the circuit analyzing device of the first embodiment, an error calculating section 11 for inputting spectrum characteristic information D6, S parameter information D8, spectrum characteristic reference information D11 as a reference value of the spectrum characteristics, and S parameter reference information D12 as a reference value of the S parameter characteristics, and for calculating an error of the spectrum characteristic information D6 and the S parameter information D8 respectively, and a waveform propagation characteristics deciding section 12 for deciding on good or bad of the waveform propagation characteristics of each wiring based on a result of the calculation by the error calculating section 11, and for generating bad wiring information (information for specifying a wiring of which waveform propagation has been decided to be bad) D13.

Figure 8:
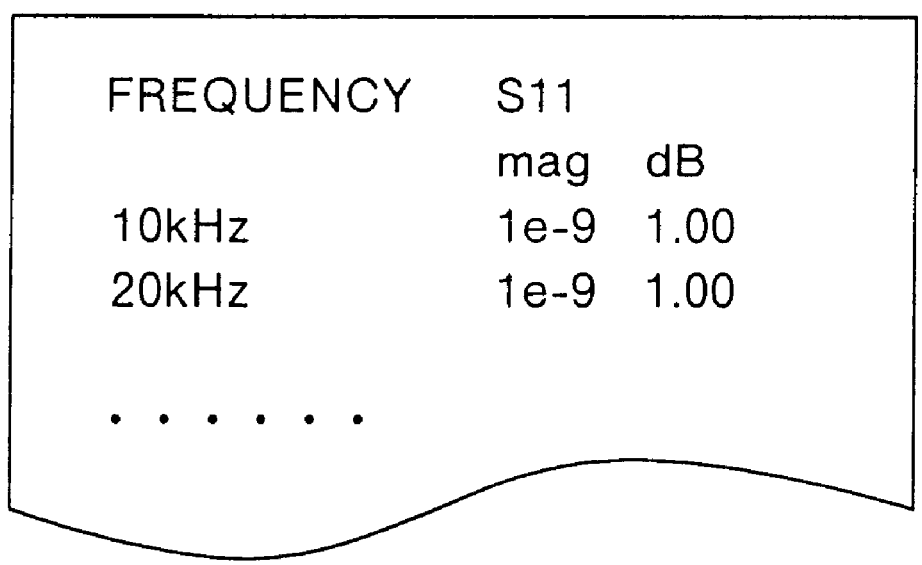
FIG. 8 is a diagram showing one example of S parameter reference information relating to the second embodiment.

The error calculating section 11 inputs the spectrum characteristic information D6 calculated by the spectrum characteristic information calculating section 6, the S parameter information D8 calculated by the S parameter information calculating section 8, the spectrum characteristic reference information D11 as the reference value (or the normal value) of the spectrum characteristics stored in advance, and the S parameter reference information D12 as the reference value (or the normal value) of the S parameter characteristics stored in advance as shown in FIG. 8, and calculates an error by comparing each reference value with the spectrum characteristic information D6 and with the S parameter information D8 respectively.

Specifically, an error (an average error rate) AE is given by the following equation (1).

$$AE = (Ef1 + \cdots + EfN)/N (\%) \qquad (1)$$

where N represents a number of frequencies to be compared, and Ef1 to EfN represent error rates in frequencies f1 to fN respectively. An error rate in any optional frequency f is given by the following equation (2).

$$Ef = \{(|Vf - Sf|)/Sf\} \cdot 100 (\%) \qquad (2)$$

where Vf represents a spectrum value of the spectrum characteristic information D6 or an S parameter value of the S parameter information D8 in the frequency f respectively, and Sf represents a spectrum value of the spectrum characteristic reference information D11 or an S parameter value of the S parameter reference information D12 in the frequency f respectively.

The waveform propagation characteristics deciding section 12 decides that the wiring is bad when these errors have satisfied a predetermined condition. For example, when at least one of the error of the spectrum characteristic information D6 and the error of the S parameter information D8 has exceeded a predetermined permissible value, the waveform propagation characteristics deciding section 12 decides the wiring as bad. The waveform propagation characteristics deciding section 12 then stores the name and the like of the wiring that has been decided as bad, and generates the bad wiring information D13. In this case, it may be so arranged that the error calculating section 11 calculates an error of only one of the spectrum characteristic information D6 and the S parameter information D8, and the waveform propagation characteristics deciding section 12 decides on good or bad of the waveform propagation characteristics of each wiring based on the error of only one of the spectrum characteristic information D6 and the S parameter information D8.

Further, it may also be so arranged that the error calculating section 11 calculates a rate of distortion (a rate of a higher harmonic to the reference wave) from the spectrum characteristic information D6, and the waveform propagation characteristics deciding section 12 makes a decision by also taking into account this distortion rate. Further, the waveform propagation characteristics deciding section 12 may make a decision based on only this distortion rate. The error calculating section 11 and the waveform propagation characteristics deciding section 12 correspond to the deciding unit of this invention respectively.

Figure 9:
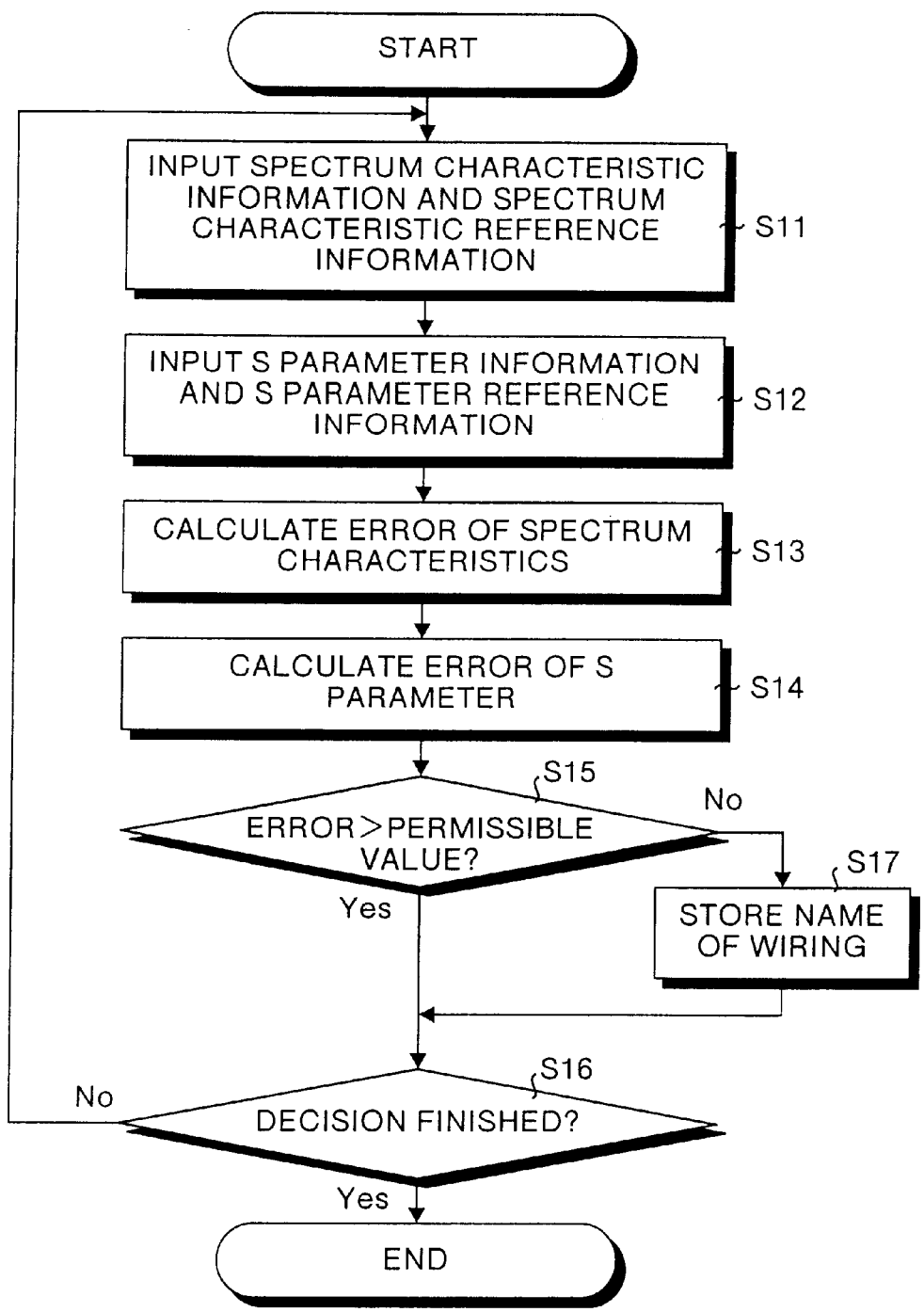
FIG. 9 is a flowchart showing a flow of the operation of the circuit analyzing device relating to the second embodiment.

The operation of the second embodiment will be explained with reference to a flowchart shown in FIG. 9. FIG. 9 is a flowchart showing a flow of the operation of the circuit analyzing device relating to the second embodiment. First, the spectrum characteristic information D6 and the S parameter information D8 are first generated in the operation similar to that of the first embodiment. The error calculating section 11 sequentially inputs the spectrum characteristic information D6 and the S parameter information D8 for each wiring, and calculates an error of the spectrum characteristic information D6 and an error of the S parameter information D8 respectively (S11, S12, S13, and S14).

Subsequently, the waveform propagation characteristics deciding section 12 compares these errors with a predetermined permissible value respectively, and makes a decision on whether or not these errors have exceeded the predetermined permissible value (S15). When all of these errors are smaller than the predetermined permissible value, the process proceeds to step S16. On the other hand, when at least one of these errors is smaller than the predetermined permissible value, the wiring name (the name of this wiring) is stored (S17), and the process proceeds to step S16. At step S16, the waveform propagation characteristics deciding section 12 makes a decision on whether or not a decision on good or bad has been made for all the wiring, and repeats steps S11 to S16 until when a decision has been made on good or bad for all the wiring. Thus, the bad wiring information D13 that describes names of wiring that are in bad wiring (the wiring of which waveform propagation characteristics are bad) is generated.

As described above, according to the second embodiment, the error calculating section 11 and the waveform propagation characteristics deciding section 12 automatically make a decision on whether or not the waveform propagation is bad or good for each wiring, based on the spectrum characteristic information D6 and the S parameter information D8. Therefore, it is possible to make a decision more easily and more securely on whether each wiring is good or bad. As a result, it is possible to further increase the reliability in the decision made on good or bad of the waveform propagation characteristics for each wiring of the circuit. Further, it is possible to further decrease the time and labor required for the circuit analysis.

Figure 10:
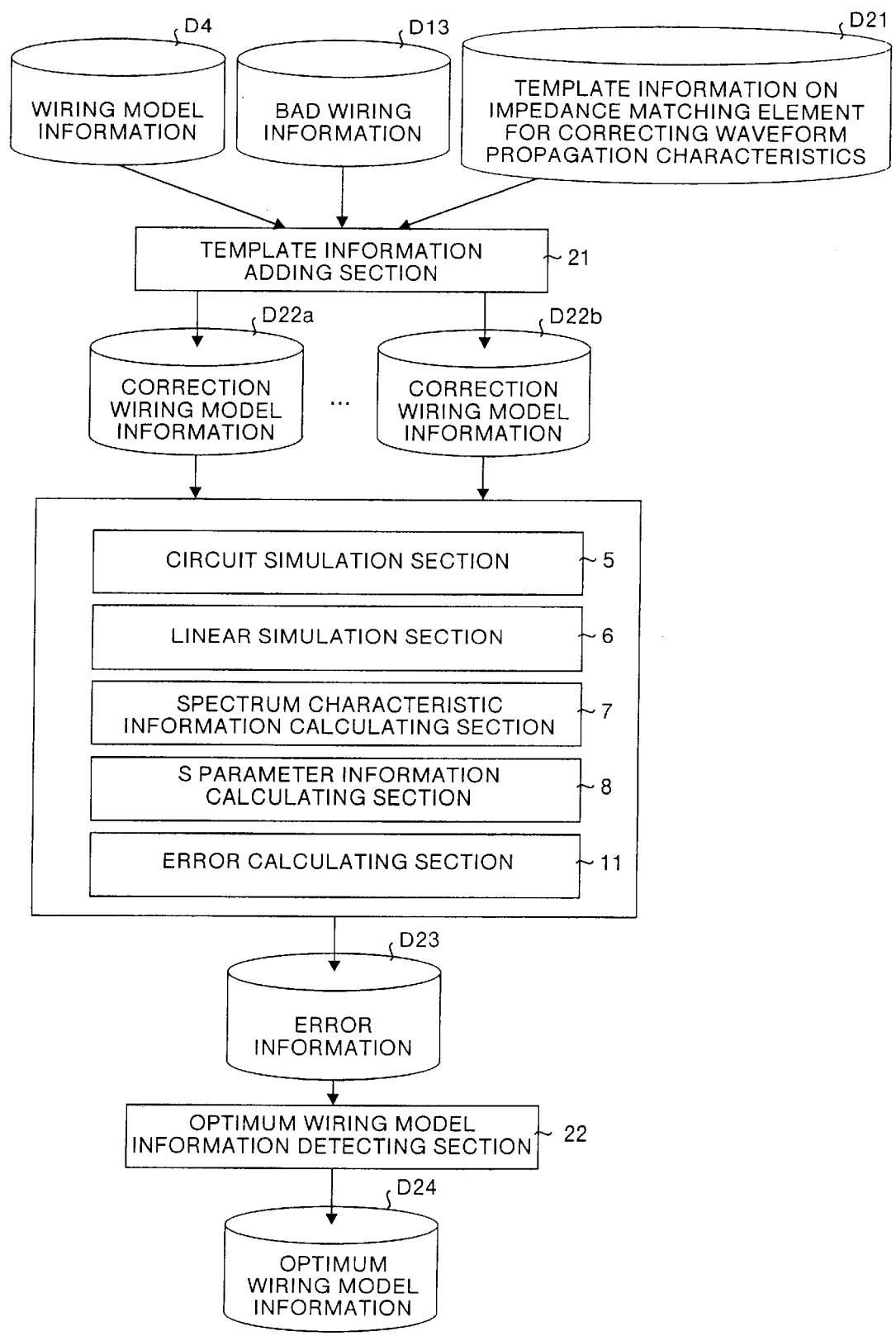
FIG. 10 is a diagram showing a structure and a data flow of a circuit analyzing device relating to a third embodiment of the present invention.

A third embodiment of this invention will now be explained. According to the third embodiment of this invention, an element for correcting the waveform propagation characteristics is further added to a wiring that has been decided to be bad, in the second embodiment. The basic structure and the basic operation of the third embodiment are similar to those of the second embodiment, and therefore, only different parts will be explained here. FIG. 10 is a diagram showing a structure and a data flow of a circuit analyzing device relating to the third embodiment of the present invention.

The circuit analyzing device of the third embodiment further includes, in addition to the structure of the circuit analyzing device of the second embodiment, a template information adding section 21 for inputting wiring model information D4, bad wiring information D13, and template information D21 of an impedance matching element (an impedance matching diode or a virtual inductance/resistor, etc.) for correcting the waveform propagation characteristics, for generating a plurality of pieces of correction wiring model information D22a to D22b having different elements of the template information D21 added to a bad wiring model, and for sequentially outputting these pieces of information to the circuit simulation section 5 and the linear simulation section 7, and an optimum wiring model information detecting section 22 for inputting error information (information on errors of the spectrum characteristic information and the S parameter information) D3 from the error calculating section 11, and for detecting correction wiring model information on a smallest error as optimum wiring model information D24.

The template information adding section 21 inputs the wiring model information D4 extracted by the wiring model information extracting section 4, the bad wiring information D13 generated by the waveform propagation characteristics deciding section 12, and the template information D21 stored in advance, generates the plurality of pieces of correction wiring model information D22a to D22b having different elements of the template information D21 added to a bad wiring model, and sequentially outputs these pieces of information to the circuit simulation section 5 and the linear simulation section 7.

The circuit simulation section 5, the spectrum characteristic information calculating section 6, the linear simulation section 7, the S parameter information calculating section 8, and the error calculating section 11 carry out a processing to each of the correction wiring model information D22a to D22b which is similar to the processing carried out to the wiring model information D4. The error information D23 of each of the correction wiring model information D22a to D22b is output from the error calculating section 11. The optimum wiring model information detecting section 22 inputs the error information D23 from the error calculating section 11, and detects correction wiring model information on the smallest error as the optimum wiring model information D24. The template information adding section 21 and the optimum wiring model information detecting section 22 correspond to the correction circuit information generating unit of this invention.

Figure 11:
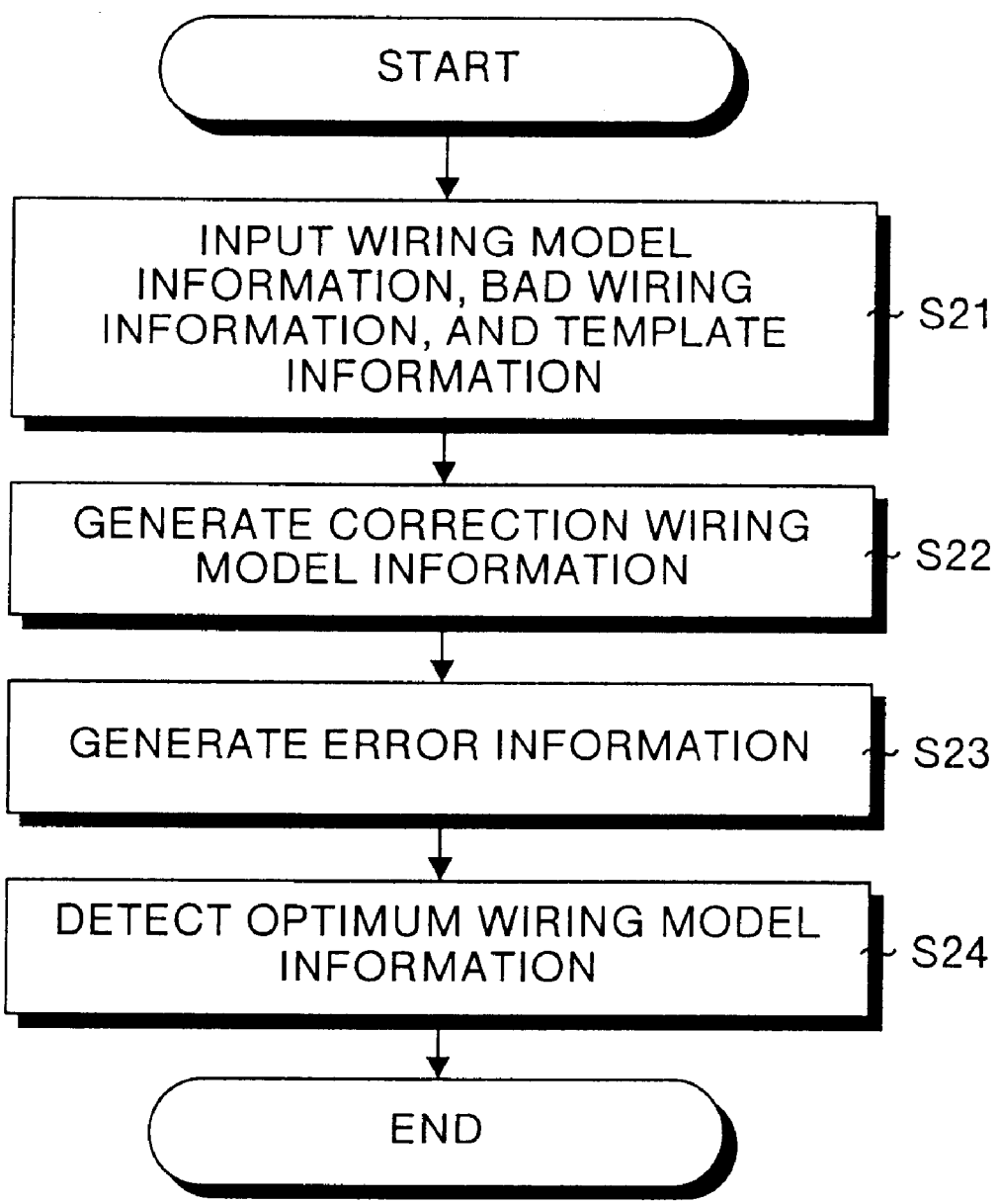
FIG. 11 is a flowchart showing a flow of the operation of the circuit analyzing device relating to the third embodiment.

The operation of the third embodiment will be explained with reference to a flowchart shown in FIG. 11. FIG. 11 is a flowchart showing a flow of the operation of the circuit analyzing device relating to the third embodiment. First, the wiring model information D4 and the bad wiring information D13 are generated in a similar operation to that of the second embodiment. Subsequently, the template information adding section 21 inputs the wiring model information D4, the bad wiring information D13, and the template information D21 (S21), generates the correction wiring model information D22a to D22b, and sequentially outputs these pieces of information to the circuit simulation section 5 and the linear simulation section 7 (S22).

Subsequently, the circuit simulation section 5, the spectrum characteristic information calculating section 6, the linear simulation section 7, and the S parameter information calculating section 8 carry out the transient response analysis, the spectrum characteristic information calculation, the frequency response analysis, and the S parameter information calculation, respectively for each of the correction wiring model information D22a to D22b. Then, the error calculating section 11 generates the error information D23 for each of the correction wiring model information D22a to D22b, and outputs a result (S23). Subsequently, the optimum wiring model information detecting section 22 inputs the error information D23, and detects the correction wiring model information on the smallest error as the optimum wiring model information D24 (S24).

As described above, according to the third embodiment, the template information adding section 21 adds the element for correcting the waveform propagation characteristics to the wiring that has been decided to be bad by the waveform propagation characteristics deciding section 12, and generates the correction wiring model information D22a to D22b. Therefore, it is possible to automatically correct the waveform propagation characteristics of the bad wiring.

Figure 12:
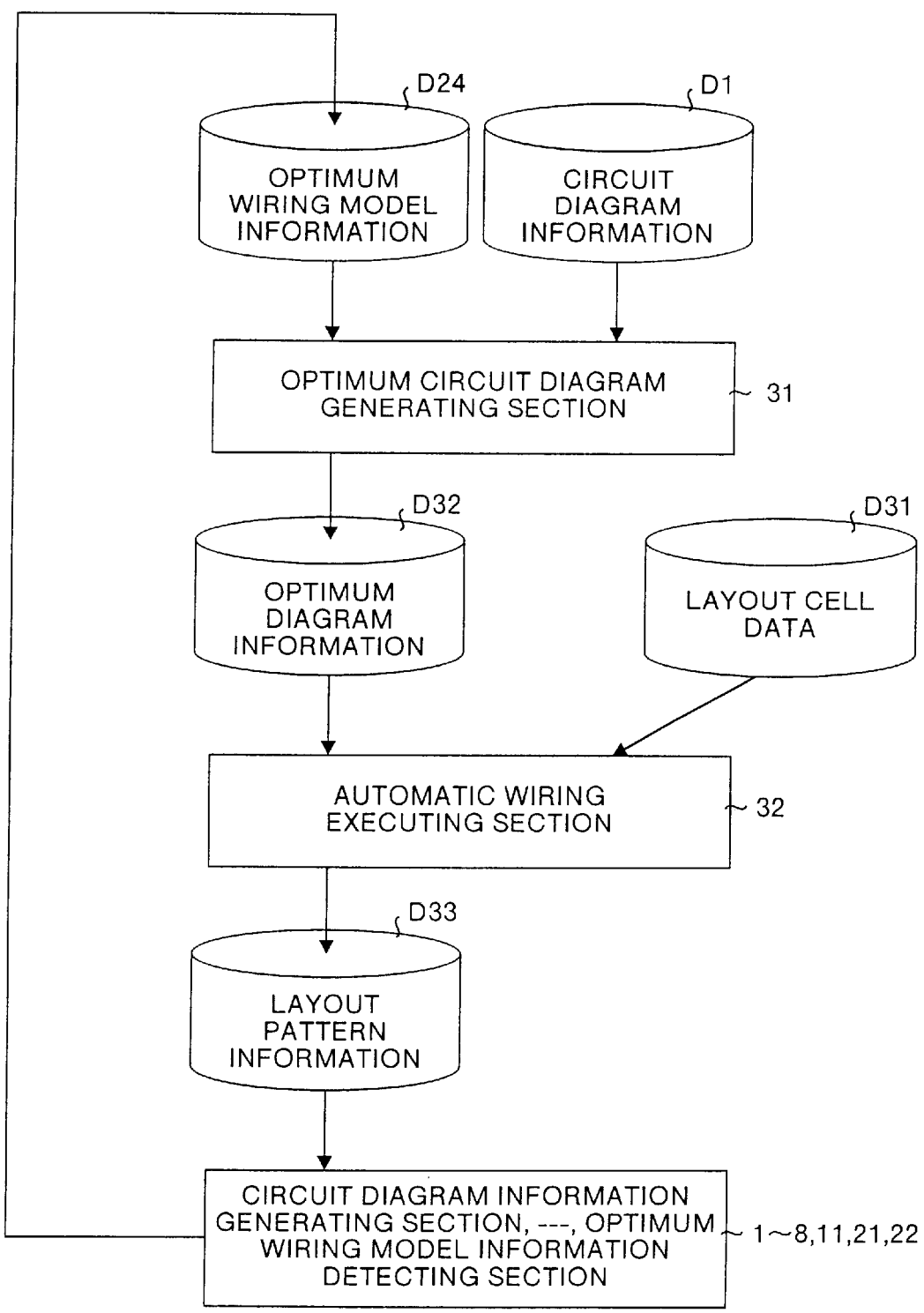
FIG. 12 is a diagram showing a structure and a data flow of a circuit analyzing device relating to a fourth embodiment of the present invention.

A fourth embodiment of this invention will now be explained. According to the fourth embodiment of this invention, in the third embodiment, layout pattern information is further generated from a waveform propagation-optimized circuit that has been obtained by combining a circuit to be analyzed with a correction circuit into which the element for correcting the waveform propagation characteristics has been inserted. Based on this arrangement, the detection of a bad wiring and the generation of a correction circuit are carried out repeatedly until when a suitable correction circuit has been obtained. The basic structure and the basic operation of the fourth embodiment are similar to those of the third embodiment, and therefore, only different parts will be explained here. FIG. 12 is a diagram showing a structure and a data flow of a circuit analyzing device relating to the fourth embodiment of the present invention.

The circuit analyzing device of the fourth embodiment further includes, in addition to the structure of the circuit analyzing device of the third embodiment, an optimum circuit diagram generating section 31 for inputting circuit diagram information D1 and optimum wiring model information D24, and for generating optimum circuit diagram information D32 having the waveform propagation characteristics corrected, and an automatic wiring executing section 32 for inputting layout cell data D31 that is information on the layout of all elements included in the optimum circuit diagram information D32, and the optimum circuit diagram information D32, for executing a known automatic wiring, for generating new layout pattern information D33, and for outputting this information to the element information extracting section 3.

The optimum circuit diagram generating section 31 inputs the circuit diagram information D1 generated by the circuit diagram information generating section 1, and the optimum wiring model information D24 detected by the optimum wiring model information detecting section 22, and generates the optimum circuit diagram information D32 by combining the optimum wiring model information D24 with the circuit diagram information D1. The automatic wiring executing section 32 inputs the optimum circuit diagram information D32 obtained and the layout cell data D31 of all elements included in the optimum circuit diagram information D32, executes the known automatic wiring, generates the new layout pattern information D33, and outputs this information to the element information extracting section 3. In this case, it may be so arranged that the automatic wiring executing section 32 extracts a layout constraint condition such as a close wiring distance from the optimum wiring model information D24, and executes the automatic wiring based on this layout constraint condition.

The element information extracting section 3, the wiring model information extracting section 4, the circuit simulation section 5, the spectrum characteristic information calculating section 6, the linear simulation section 7, the S parameter information calculating section 8, the error calculating section 11, the template information adding section 21, and the optimum wiring model information detecting section 22 carry out a processing to the new layout pattern information D33 which is similar to the processing carried out to the layout pattern information D2. When a bad wiring has been detected, the new optimum wiring model information D24 is generated. The automatic wiring executing section 32 corresponds to the layout information generating unit of this invention.

Figure 13:
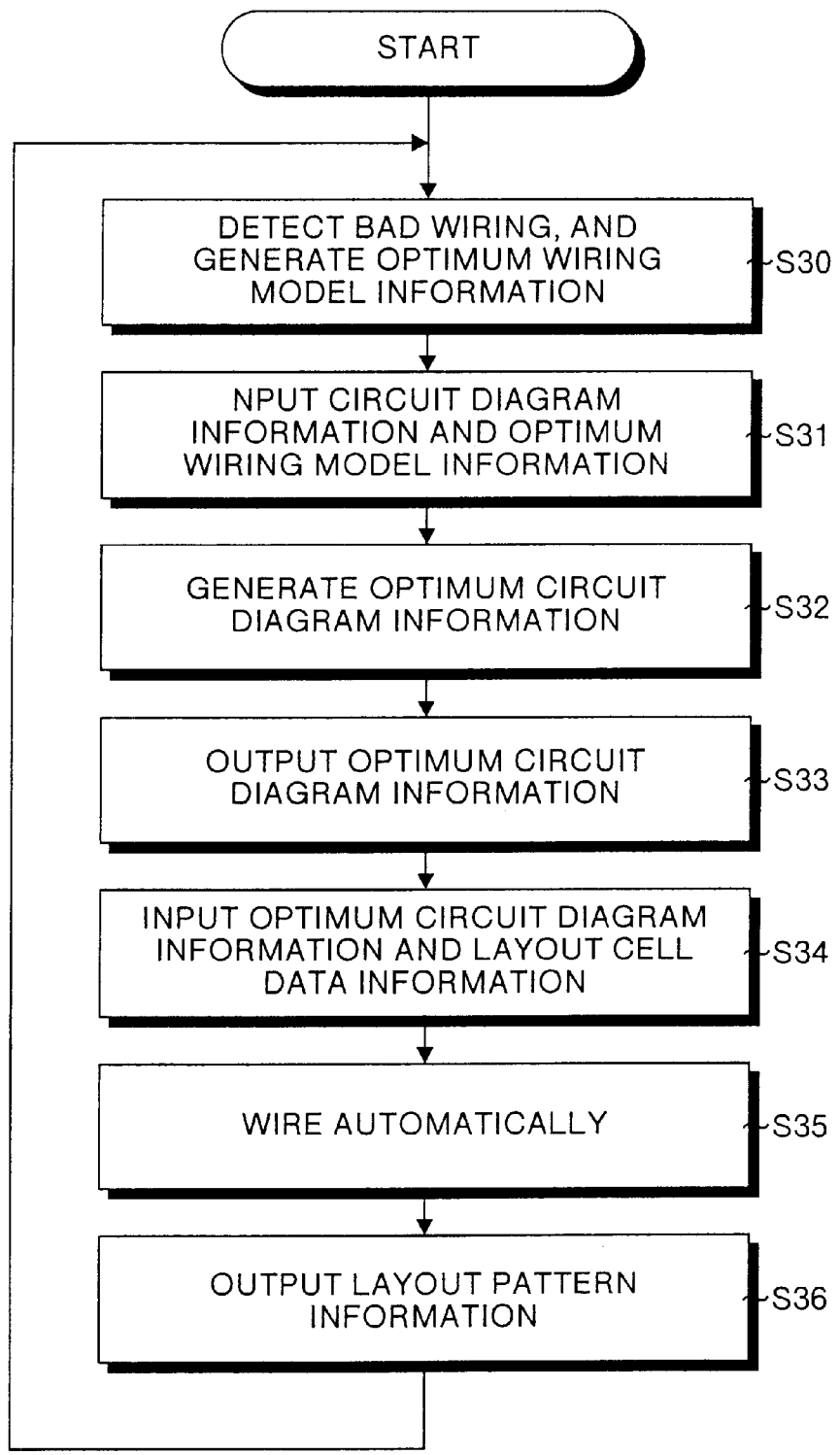
FIG. 13 is a flowchart showing a flow of the operation of the circuit analyzing device relating to the fourth embodiment.

The operation of the fourth embodiment will be explained with reference to a flowchart shown in FIG. 13. FIG. 13 is a flowchart showing a flow of the operation of the circuit analyzing device relating to the fourth embodiment. First, the detection processing of a bad wiring and the generation processing of the optimum wiring model information D24 are carried out in an operation similar to that of the first to the third embodiments (S30). Subsequently, the optimum circuit diagram generating section 31 inputs the circuit diagram information D1 and the optimum wiring model information D24 (S31). Then, the optimum circuit diagram generating section 31 combines the circuits (S32), and outputs the optimum circuit diagram information D32 (S33). Subsequently, the automatic wiring executing section 32 inputs the generated optimum circuit diagram information D32 and the layout cell data D31 (S34). Then, the automatic wiring executing section 32 executes the automatic wiring (S35), generates the new layout pattern information D33, and outputs this information (S36). Then, the execution of steps S30 to S36 is repeated until when no bad wiring has been detected.

As described above, according to the fourth embodiment, the automatic wiring executing section 32 generates the new layout pattern information D33 based on the optimum wiring model information D24 generated by the template information adding section 21. Further, the element information extracting section 3 and the wiring model information extracting section 4 generate the wiring model information for each wiring of the correction circuit including the LC circuit parasitic and RC circuit parasitic information, based on the new layout pattern information D33. Therefore, it is possible to obtain an optimum circuit by repeatedly analyzing the correction circuit until when there is no bad wiring.

Figure 14:
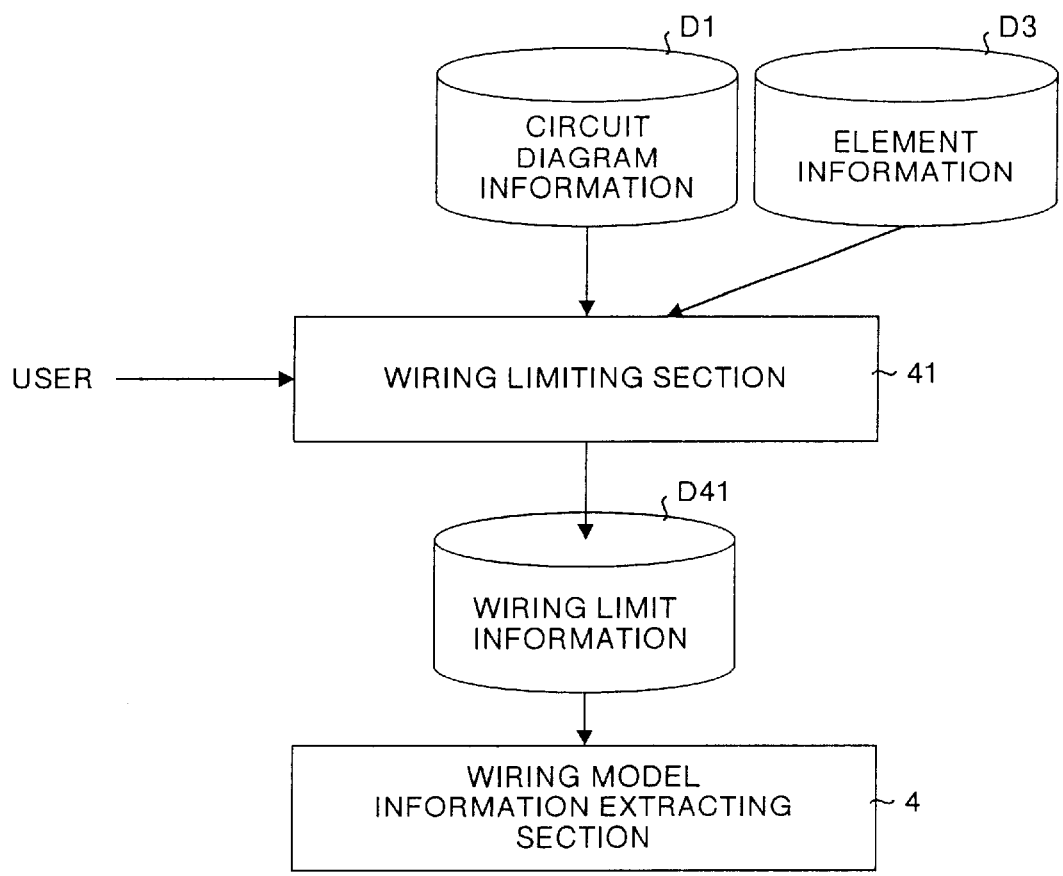
FIG. 14 is a diagram showing a structure and a data flow of a circuit analyzing device relating to a fifth embodiment of the present invention.

A fifth embodiment of this invention will now be explained. According to the fifth embodiment of this invention, in the first to the fourth embodiments, only a part of a circuit is analyzed. The basic structure and the basic operation of the fifth embodiment are similar to those of the first to the fourth embodiments, and therefore, only different parts will be explained here. FIG. 14 is a diagram showing a structure and a data flow of a circuit analyzing device relating to the fifth embodiment of the present invention.

The circuit analyzing device of the fifth embodiment further includes, in addition to the structures of the circuit analyzing devices of the first to the fourth embodiments, a wiring limiting section 41 for inputting circuit diagram information D1 or element information D3, for generating wiring limit information D41 that limits a wiring to be analyzed, and for outputting this information to the wiring model information extracting section 4. The wiring limiting section 41 limits the wiring to be analyzed based on an assignment from a user. It may also be so arranged that the wiring limiting section 41 verifies a static timing of the circuit to be analyzed, and limits only the wiring of strict constraint on the circuit operation and timing as the wiring to be analyzed. The wiring model information extracting section 4 generates the wiring model information on only a part of the circuit, based on the wiring limit information D41 from the wiring limiting section 41. The wiring limiting section 41 corresponds to the assigning unit of this invention.

Figure 15:
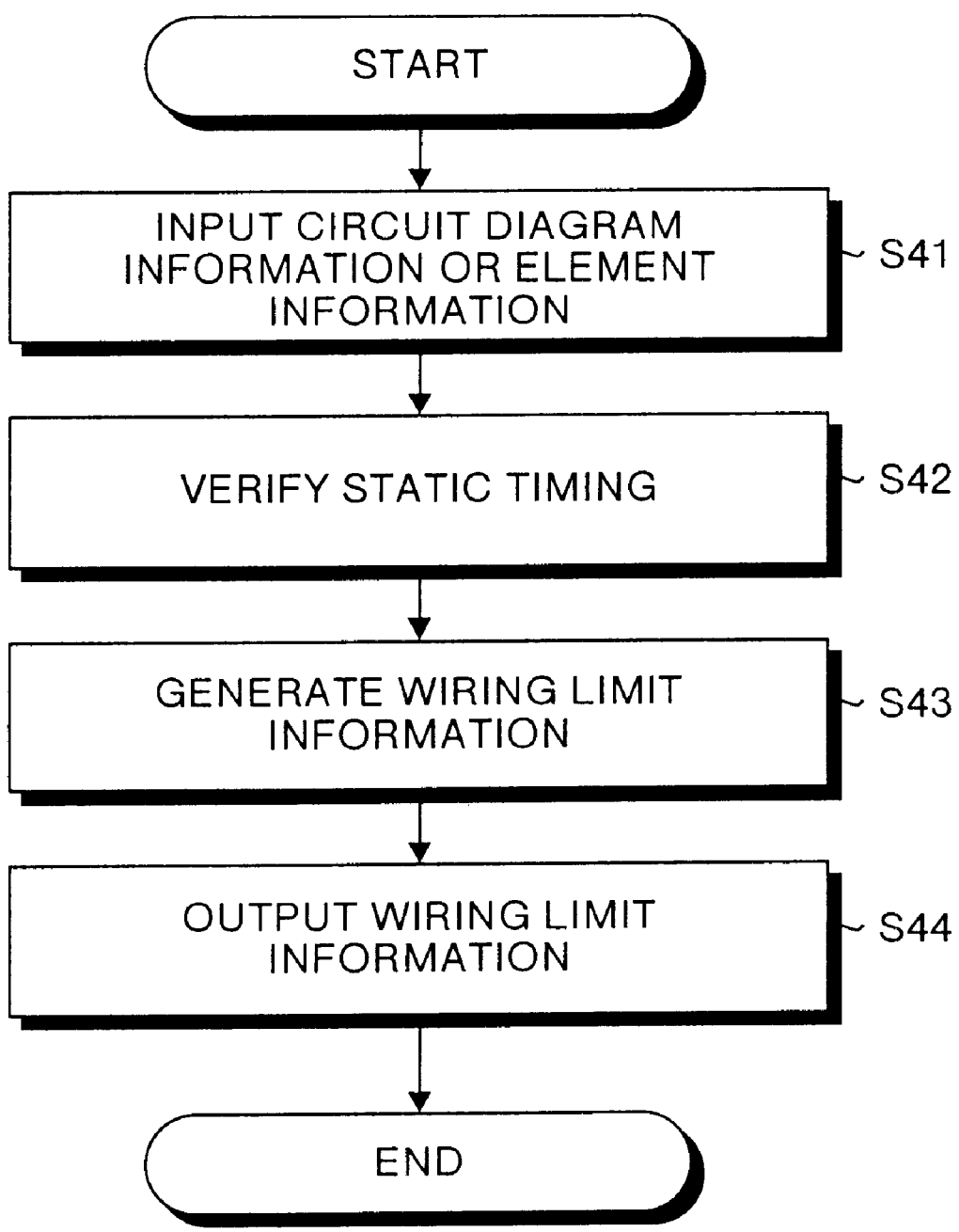
FIG. 15 is a flowchart showing a flow of the operation of the circuit analyzing device relating to the fifth embodiment.
Figure 16:
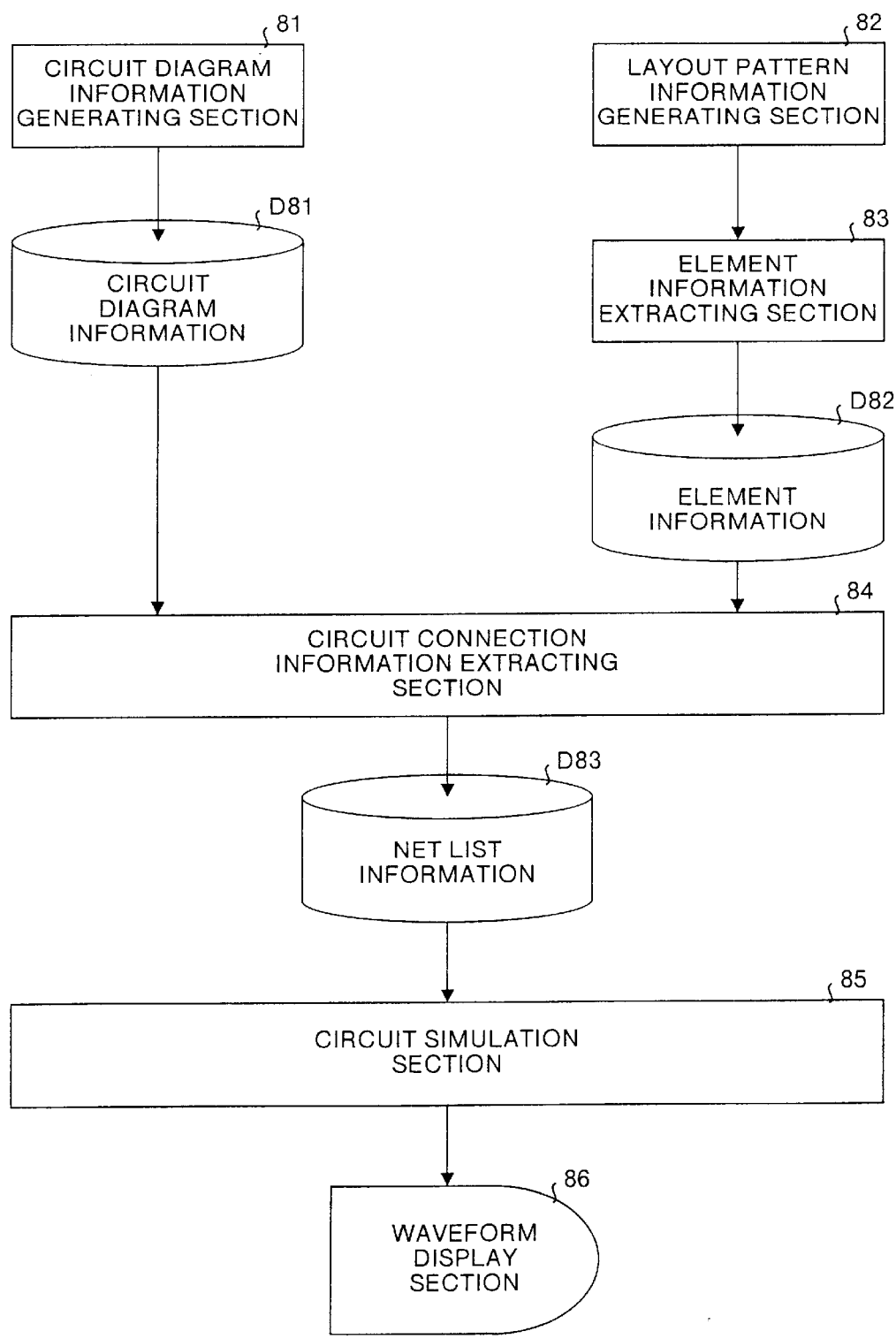
FIG. 16 is a diagram showing a structure and a data flow of a conventional circuit analyzing device.
Figure 17:
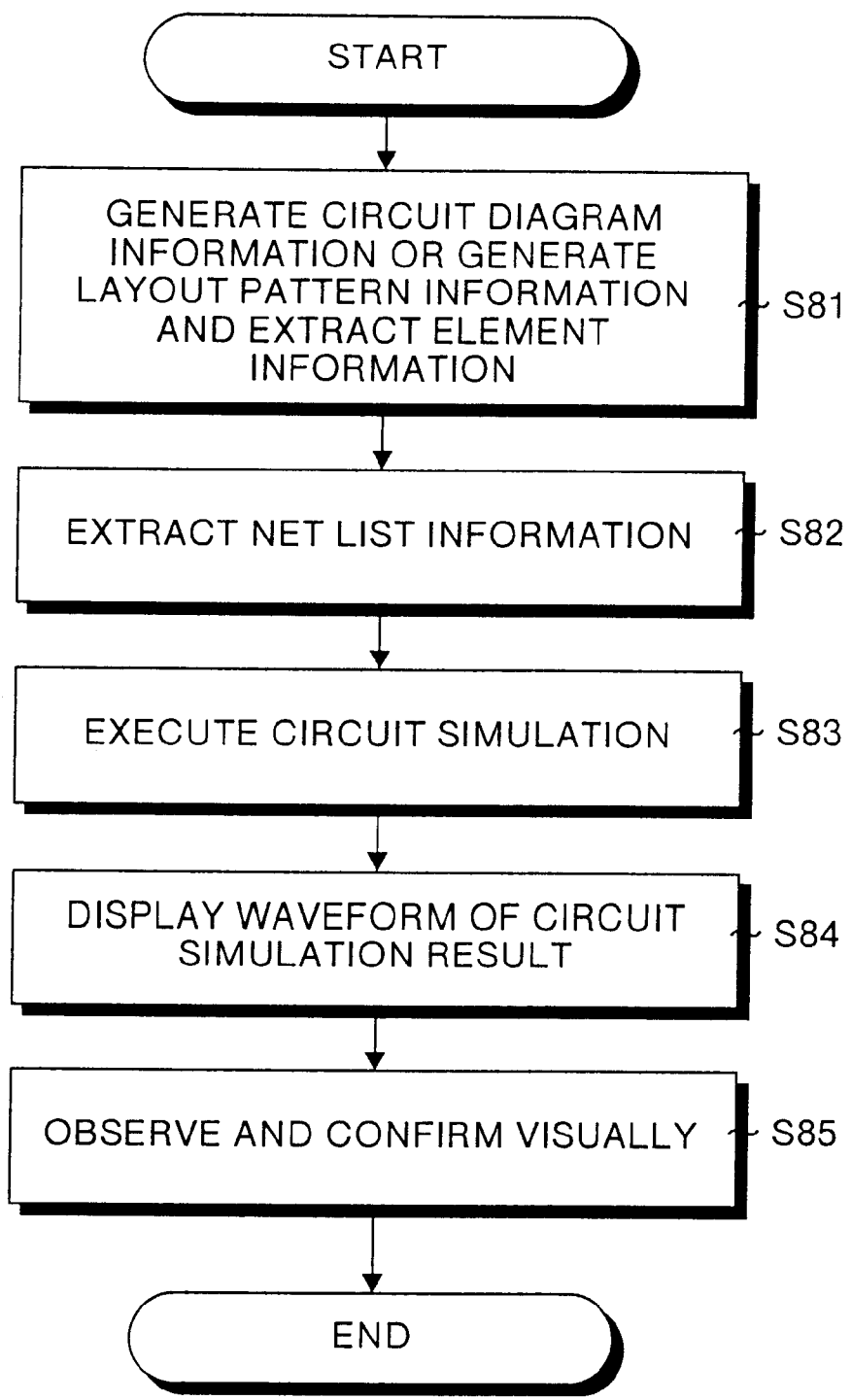
FIG. 17 is a flowchart showing a flow of the operation of the conventional circuit analyzing device.

The operation of the fifth embodiment will be explained with reference to a flowchart shown in FIG. 15. FIG. 15 is a flowchart showing a flow of the operation of the circuit analyzing device relating to the fifth embodiment. First, the wiring limiting section 41 inputs the circuit diagram information D1 or the element information D3 (S41), and carries out the static timing verification (S42). Then, the wiring limiting section 41 generates the wiring limit information D41 (S43), and outputs this information to the wiring model information extracting section 4 (S44). Other operation is similar to that of the first to the fifth embodiments. However, the detection of a bad wiring and the analysis operation like the addition of the correction element are carried out for only a part of the circuit assigned by the wiring limit information D41.

As described above, according to the fifth embodiment, the wiring limiting section 41 assigns a part of the circuit to be analyzed, and the wiring model information extracting section 4 extracts the wiring model information on only a part of the circuit assigned by the wiring limiting section 41. Therefore, it is possible to further decrease the time required for the circuit analysis.

A computer program for realizing the above-described circuit analyzing method relating to the first to fifth embodiments can also be stored into a portable recording medium such as a magnetic disk like a floppy disk, a semiconductor memory (including that incorporated in a cartridge or a PC card) like a ROM, an EPROM, an EEPROM, a flash ROM, etc., an optical disk like a CD-ROM, a DVD, etc., or an optical magnetic disk like an MO, etc. Then, the program recorded on this recording medium may be installed onto a fixed recording medium like a ROM, a RAM, a hard disk, etc. that are incorporated in the circuit analyzing device, thereby providing the circuit analyzing device with the function of the circuit analysis.

Further, this program can also be transmitted via a network like a LAN, a WAN, Internet, etc., and installed onto the fixed recording medium for the circuit analyzing device. This program is not necessarily limited to a one formed in a single structure, but may also be formed in a distributed structure as a plurality of modules and libraries. The program may also be a one that achieves its function in co-operation with separate programs of an OS and the like.

As explained above, according to the present invention, the wiring model information generating unit generates wiring model information for each wiring of a circuit, and the analyzing unit analyzes waveform propagation characteristics of each wiring model information that has been generated by the wiring model information generating unit. Therefore, it is possible to obtain quantitative information for making a decision, and it becomes possible to easily make a secure decision for each wiring. As a result, there is an effect that it is possible to increase the reliability in the decision made on good or bad of the waveform propagation characteristics for each wiring of the circuit. Further, there is an effect that it is possible to decrease the time and labor required for analyzing the circuit.

Further, the wiring model information generating unit generates the wiring model information including LC circuit parasitic and RC circuit parasitic information based on layout information of the circuit. Therefore, there is an effect that it is possible to carry out a more suitable analysis particularly in the case of analyzing a circuit that processes a high-frequency digital signal of 1 GHz or above.

Further, the analyzing unit analyzes spectrum characteristics and/or S parameter characteristics. Therefore, there is an effect that it is possible to carry out a more detailed analysis.

Further, the deciding unit automatically decides on whether each wiring is bad or good in waveform propagation, based on a result of the analysis of the analyzing unit. Therefore, it is possible to decide on good or bad of each wiring more easily and securely. As a result, there is an effect that it is possible to further increase the reliability in the decision made on good or bad of the waveform propagation characteristics for each wiring of the circuit. Further, there is an effect that it is possible to decrease the time and labor required for analyzing the circuit.

Further, the correction circuit information generating unit generates correction circuit information on a correction circuit having an element for correcting waveform propagation characteristics added to a wiring that has been decided as bad by the deciding unit. Therefore, there is an effect that it is possible to automatically correct the waveform propagation characteristics of the bad wiring.

Further, the layout information generating unit generates layout information of the correction circuit, based on the correction circuit information that has been generated by the correction circuit information generating unit, and the wiring model information generating unit generates wiring model information for each wiring of the correction circuit including LC circuit parasitic and RC circuit parasitic information, based on the layout information that has been generated by the layout information generating unit. Therefore, there is an effect that it is possible to obtain an optimum circuit by repeatedly carrying out the analysis of the correction circuit until when there is no bad wiring.

Further, the assigning unit assigns a part of a circuit as a part to be analyzed, and the wiring model information generating unit generates wiring model information for only a part of the circuit that has been assigned by the assigning unit. Therefore, there is an effect that it is possible to further decrease the time required for analyzing the circuit.

Further, according to the present invention, at the wiring model information generating step, wiring model information is generated for each wiring of a circuit, and at the analysis step, waveform propagation characteristics are analyzed for each wiring model information that has been generated at the wiring model information generating step. Therefore, it is possible to obtain quantitative information for making a decision, and it becomes easily possible to make a secure decision for each wiring. As a result, there is an effect that it is possible to increase the reliability in the decision made on good or bad of the waveform propagation characteristics for each wiring of the circuit. Further, there is an effect that it is possible to decrease the time and labor required for analyzing the circuit.

Further, at the wiring model information generating step, the wiring model information including LC circuit parasitic and RC circuit parasitic information is generated based on layout information of the circuit. Therefore, there is an effect that it is possible to carry out a more suitable analysis particularly in the case of analyzing a circuit that processes a high-frequency digital signal of 1 GHz or above.

Further, at the analysis step, spectrum characteristics and/or S parameter characteristics are analyzed. Therefore, there is an effect that it is possible to carry out a more detailed analysis.

Further, at the decision step, whether each wiring is bad or good in waveform propagation is automatically decided based on a result of the analysis at the analysis step. Therefore, there is an effect that it is easily possible to make a more secure decision on good or bad of each wiring.

Further, at the correction circuit information generating step, there is generated correction circuit information on a correction circuit having an element for correcting waveform propagation characteristics added to a wiring that has been decided as bad at the decision step. Therefore, there is an effect that it is possible to automatically correct the waveform propagation characteristics of the bad wiring.

Further, at the layout information generating step, layout information of the correction circuit is generated, based on the correction circuit information that has been generated at the correction circuit information generating step, and at the wiring model information generating step, there is generated wiring model information for each wiring of the correction circuit including LC circuit parasitic and RC circuit parasitic information, based on the layout information that has been generated at the layout information generating step. Therefore, there is an effect that it is possible to obtain an optimum circuit by repeatedly carrying out the analysis of the correction circuit until when there is no bad wiring.

Further, at the assignment step, a part of a circuit is assigned as a part to be analyzed, and at the wiring model information generating step, wiring model information is generated for only a part of the circuit that has been assigned at the assignment step. Therefore, there is an effect that it is possible to further decrease the time required for analyzing the circuit.

Further, according to the present invention, a program for making a computer execute the methods of the present invention has been recorded. Therefore, the program can be read by the computer. As a result, there is an effect that it is possible to execute the operation of the methods of the invention by the computer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A circuit analyzing device comprising:
   a wiring model information generating unit for generating wiring model information for each wiring of a circuit;
   an analyzing unit for analyzing waveform propagation characteristics of each wiring model information that has been generated by said wiring model information generating unit;
   an error calculating unit for calculating an error of the waveform propagation characteristics by comparing an analysis of the waveform propagation characteristics by said analyzing unit to waveform propagation characteristic reference values; and
   a deciding unit for automatically determining whether each wiring is bad or good in waveform propagation, based on the error calculated by said error calculating unit.

2. The circuit analyzing device according to claim 1, wherein
   said wiring model information generating unit generates the wiring model information including LC circuit parasitic and RC circuit parasitic information based on layout information of the circuit.

3. The circuit analyzing device according to claim 1, wherein said analyzing unit analyzes at least one of spectrum characteristics and S parameter characteristics.

4. The circuit analyzing device according to claim 1, further comprising a correction circuit information generating unit for generating correction circuit information on a correction circuit having an element for correcting waveform propagation characteristics added to a wiring that has been determined as bad by said deciding unit.

5. The circuit analyzing device according to claim 4, further comprising a layout information generating unit for generating layout information of the correction circuit, based on the correction circuit information that has been generated by the correction circuit information generating unit, wherein said wiring model information generating unit generates wiring model information for each wiring of the correction circuit including LC circuit parasitic and RG circuit parasitic information, based on the layout information that has been generated by said layout information generating unit.

6. The circuit analyzing device according to claim 1, further comprising an assigning unit for assigning a part of a circuit as a part to be analyzed, wherein said wiring model information generating unit generates wiring model information for only a part of the circuit that has been assigned by said assigning unit.

7. A circuit analyzing method comprising:
   generating wiring model information for each wiring of a circuit;
   analyzing waveform propagation characteristics of each wiring model information that has been generated;
   calculating an error of the waveform propagation characteristics by comparing an analysis of the waveform propagation characteristics to waveform propagation characteristic reference values; and
   automatically determining whether each wiring is bad or good in waveform propagation, based on the error that has been calculated.

8. The circuit analyzing method according to claim 7, wherein generating wiring model information includes generating LC circuit parasitic and RC circuit parasitic information based on layout information of the circuit.

9. The circuit analyzing method according to claim 7, wherein analyzing waveform propagation characteristics includes analyzing at least one of spectrum characteristics and S parameter characteristics.

10. The circuit analyzing method according to claim 7, further comprising generating correction circuit information of a correction circuit having an element correcting waveform propagation characteristics added to a wiring that has been determined as bad.

11. The circuit analyzing method according to claim 10, further comprising generating layout information of the correction circuit based on the correction circuit information and generating wiring model information for each wiring of the correction circuit, including LC circuit parasitic and RC circuit parasitic information, based on the layout information.

12. The circuit analyzing method according to claim 7, further comprising assigning a part of a circuit as a part to be analyzed, wherein wiring model information is generated for only a part of the circuit that has been assigned.

13. A computer-readable medium having computer-executable instructions that cause a computer to:

generate wiring model information for each wiring of a circuit;

analyze waveform propagation characteristics of each wiring model information generated;

calculate an error of the waveform propagation characteristics by comparing an analysis of the waveform propagation characteristics to waveform propagation characteristic reference values; and automatically determine whether each wiring is bad or good in waveform propagation, based on the error that has been calculated.

* * * * *